United States Patent
Iwase

(10) Patent No.: US 6,864,719 B2
(45) Date of Patent: Mar. 8, 2005

(54) SEMICONDUCTOR DEVICE PROTECTING BUILT-IN TRANSISTOR FROM THE VOLTAGE APPLIED AT TEST MODE

(75) Inventor: Taira Iwase, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 10/401,585

(22) Filed: Mar. 31, 2003

(65) Prior Publication Data

US 2004/0046575 A1 Mar. 11, 2004

(30) Foreign Application Priority Data

Mar. 29, 2002 (JP) .................................. P2002-097918

(51) Int. Cl.[7] .......................................... H03K 19/0175
(52) U.S. Cl. .......................................... 326/81; 326/83
(58) Field of Search ........................ 326/26, 27, 80–83, 326/86, 87, 16

(56) References Cited

U.S. PATENT DOCUMENTS

| | | | |
|---|---|---|---|
| 5,397,984 A | | 3/1995 | Koshikawa |
| 5,530,378 A | * | 6/1996 | Kucharewski et al. ........ 326/41 |
| 5,862,390 A | * | 1/1999 | Ranjan ...................... 713/300 |
| 5,903,165 A | * | 5/1999 | Jones et al. .................... 326/39 |
| RE37,195 E | * | 5/2001 | Kean ............................ 326/39 |
| 6,262,597 B1 | * | 7/2001 | Bauer et al. ................... 326/41 |
| 6,407,581 B1 | * | 6/2002 | Hull et al. ..................... 326/83 |
| 6,480,026 B2 | * | 11/2002 | Andrews et al. ............... 326/39 |
| 6,483,346 B2 | * | 11/2002 | Kunz et al. .................... 326/81 |
| 6,515,507 B1 | * | 2/2003 | Patel et al. .................... 326/38 |
| 6,784,717 B1 | * | 8/2004 | Hunt et al. ................. 327/318 |

FOREIGN PATENT DOCUMENTS

JP          11-281714          10/1999

* cited by examiner

*Primary Examiner*—Don Le
(74) *Attorney, Agent, or Firm*—Oblon, Spivak, McClelland, Maier & Neustadt, P.C.

(57) ABSTRACT

A semiconductor device comprises a high-voltage detector for generating a test mode signal and a detection signal when a test mode setting signal is inputted from an input terminal for inputting, as a first input signal, any one of a normal signal and the test mode setting signal having a higher voltage than the normal signal, an input circuit for generating a normal mode signal in accordance with the normal signal, and a protection circuit for reducing an electric field between an input side and a low-voltage power supply side of the input circuit in accordance with the detection signal, the electric field being generated by inputting the test mode setting signal thereto.

17 Claims, 11 Drawing Sheets

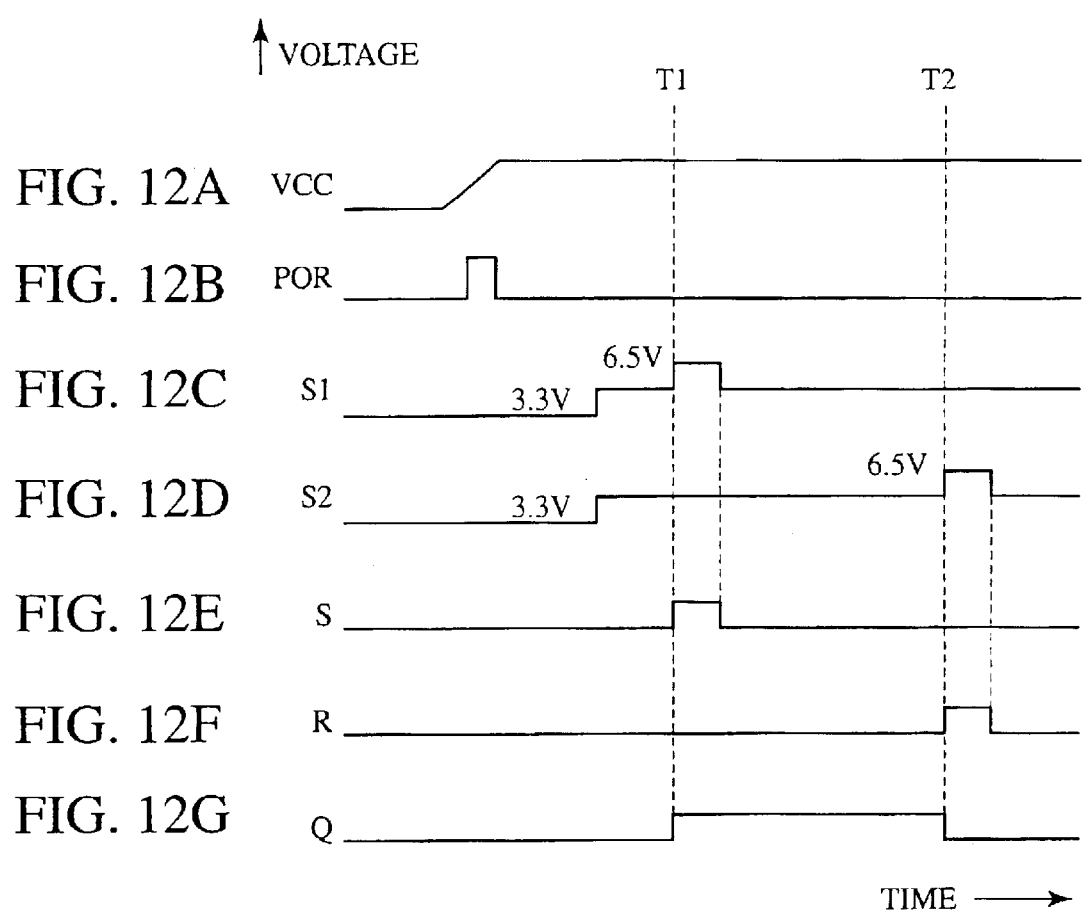

SEMICONDUCTOR DEVICE PROTECTING BUILT-IN TRANSISTOR FROM THE VOLTAGE APPLIED AT TEST MODE

CROSS REFERENCE TO RELATED APPLICATIONS

This application is based upon and claims the benefit of priority from the prior Japanese Patent Applications No. P2002-097918, filed on Mar. 29, 2002; the entire contents of which are incorporated herein by reference.

BACKGROUND OF THE INVENTION

1. Field of the Invention

The present invention relates to a semiconductor device, and more specifically to a semiconductor device provided with a test mode in addition to a normal mode.

2. Description of the Related Art

Among semiconductor devices including semiconductor memories, ones provided with test modes for executing operation tests have been known. A semiconductor device is changed from a normal mode to a test mode by applying a test mode setting signal to a test pad on the chip. In order to change from a normal mode to a test mode easily in a short time, the states of being assembled in packages have been ideal for executing operation tests of semiconductor devices. Recently, in order to reduce the number of input terminals, one having a common terminal used as both a normal signal input terminal and a test input terminal is being developed.

In general, a semiconductor device comprising an input terminal, an input circuit connected to the input terminal, and a high-voltage detector connected to the input terminal and the input circuit has been known. A CMOS inverter is provided on the input side of the input circuit. The CMOS inverter comprises pMOS and nMOS transistors. The gate terminals of the pMOS and nMOS transistors are respectively connected to the input terminal. The drain terminals of the pMOS and nMOS transistors form the output terminal of the CMOS inverter. The source terminal of the pMOS transistor is connected to the power supply side. The source terminal of the nMOS transistor is connected to the ground side.

When a voltage for a normal mode is inputted, the input circuit outputs a normal mode signal. When the voltage inputted from the input terminal reaches a threshold value or more, the high-voltage detector outputs a test mode signal. Specifically, the semiconductor device switches between the normal mode and the test mode in accordance with the voltage of a signal inputted from the input terminal.

However, in semiconductor devices including semiconductor memories, process parameters including the threshold voltages of transistors used in high-voltage detectors have varied. Therefore, detected voltages have had errors. In the worst case, a system using a memory may be changed from a normal mode to a test mode due to a malfunction caused by noise. In order to prevent malfunctions, there is a method of setting a test mode setting voltage higher. If a test mode setting voltage is raised, a higher voltage is constantly applied to the input side of an input circuit. On the other hand, the scaling of vertical structures has been progressed by miniaturization, and gate oxide films have been thinned. Since gate oxide films have become thinner, the application of high voltages to the input sides of input circuits has been concerned that the application causes reliability problems. There has been a problem that, if gate oxide films became yet thinner in the future, the application of high voltages to the input sides of input circuits would become increasingly unpreferable in terms of reliability.

SUMMARY OF THE INVENTION

In a first aspect of the present invention, a semiconductor device comprises a high-voltage detector for generating a test mode signal and a detection signal when a test mode setting signal is inputted from an input terminal for inputting, as a first input signal, any one of a normal signal and the test mode setting signal having a higher voltage than the normal signal, an input circuit for generating a normal mode signal in accordance with the normal signal, and a protection circuit for reducing an electric field between an input side and a low-voltage power supply side of the input circuit in accordance with the detection signal, the electric field being generated by inputting the test mode setting signal thereto.

In a second aspect of the present invention, a semiconductor device comprises a high-voltage detector for generating a test mode signal and a detection signal when a test mode setting signal is inputted from an input terminal for inputting, as a first input signal, any one of a normal signal and the test mode setting signal having a higher voltage than the normal signal, a protection circuit for outputting a divided voltage of the test mode setting signal to an output side in accordance with the detection signal, and an input circuit for outputting a normal mode signal in accordance with the divided voltage.

In a third aspect of the present invention, a semiconductor device comprises an input circuit for generating a normal mode signal when a normal signal is inputted from an input terminal for inputting, as a first input signal, any one of the normal signal and a test mode setting signal having a higher voltage than the normal signal, a high-voltage detector for generating a detection signal in accordance with the test mode setting signal, and a test-signal generator for generating a test mode signal using the detection signal as a trigger.

In a fourth aspect of the present invention, a semiconductor device comprises a first input circuit for outputting a first normal mode signal when a first normal signal is inputted from a first input terminal for inputting, as a first input signal, any one of the first normal signal and a first test mode setting signal having a higher voltage than the first normal signal, a first high-voltage detector for generating a first detection signal when the first test mode setting signal is inputted, a second input circuit for generating a second normal mode signal when a second normal signal is inputted from a second input terminal for inputting, as a second input signal, any one of the second normal signal and a second test mode setting signal having a higher voltage than the second normal signal, a second high-voltage detector for generating a second detection signal when the second test mode setting signal is inputted, and a flip-flop circuit for alternately switching a test mode signal between on and off in accordance with the first and second detection signals.

BRIEF DESCRIPTION OF DRAWINGS

FIGS. 12A to 12G are timing charts illustrating a circuit example of the semiconductor device according to Fourth Embodiment of the present invention.

DETAILED DESCRIPTION OF THE INVENTION

Figure 1:
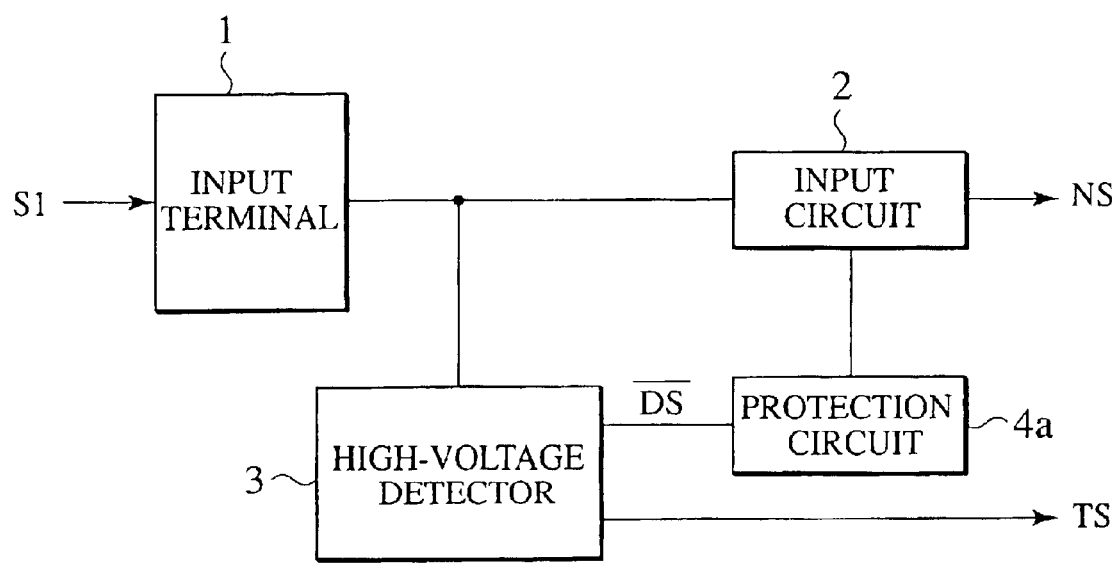
FIG. 1 is a diagram illustrating a semiconductor device according to First Embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
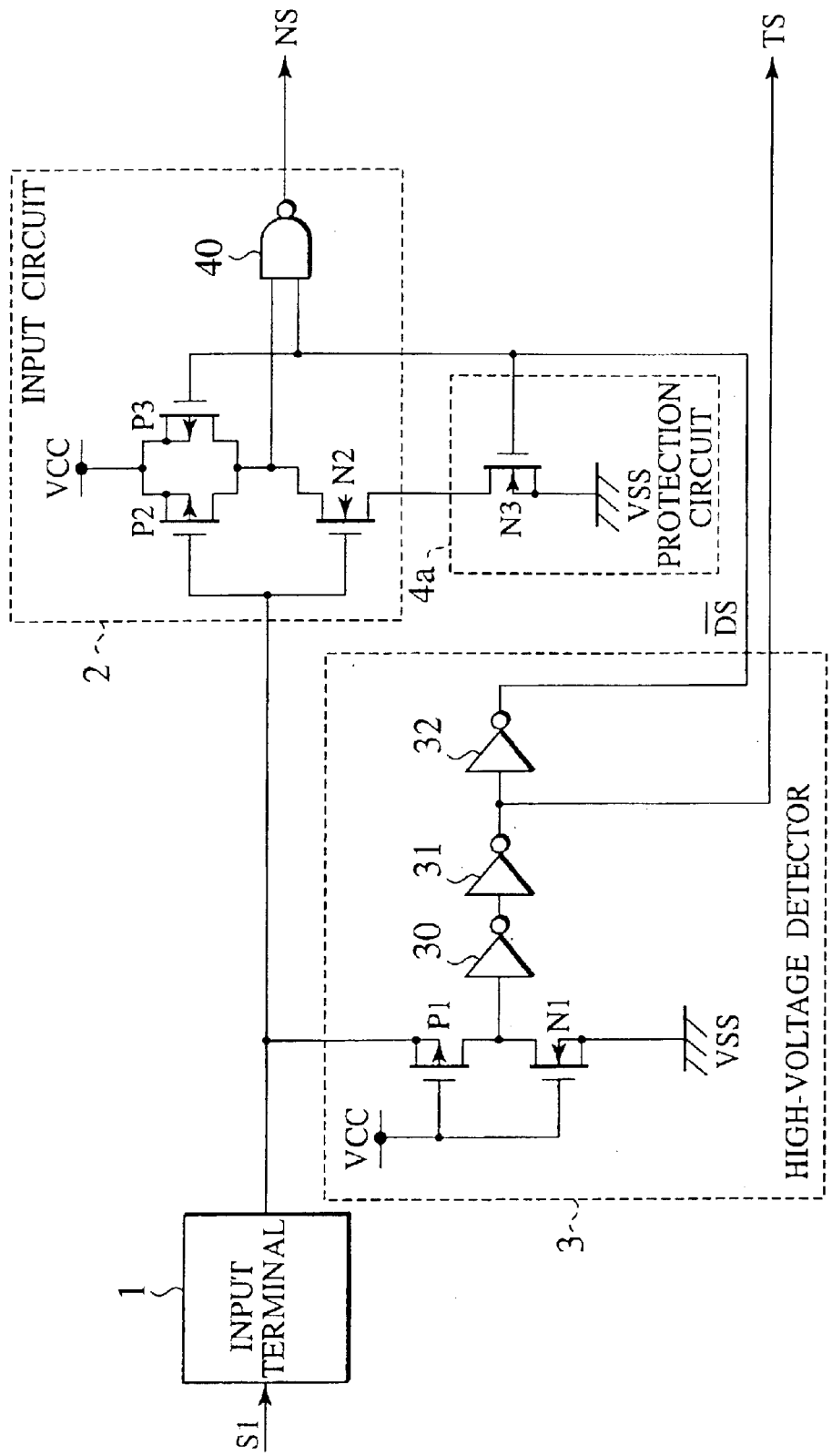
FIG. 2 is a diagram illustrating a circuit example of the semiconductor device according to First Embodiment of the present invention.

In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.
First Embodiment As shown in FIG. 1, a semiconductor device according to First Embodiment of the present invention comprises an input terminal 1, a high-voltage detector 3 connected to the input terminal 1, an input circuit 2 connected to the input terminal 1, a protection circuit 4a connected to the input circuit 2 and the high-voltage detector 3. As shown in FIG. 2, the high-voltage detector 3 comprises, for example, a first sensing transistor (pMOSFET) P1, a second sensing transistor (nMOSFET) N1, a first inverter 30, a second inverter 31, and a third inverter 32. The first sensing transistor P1 has a source terminal connected to the input terminal 1 and a gate terminal connected to a high-voltage power supply VCC. The second sensing transistor N1 has a drain terminal connected to the drain terminal of the first sensing transistor P1, a gate terminal connected to the high-voltage power supply VCC, and a source terminal connected to a low-voltage power supply VSS. The first inverter 30 has an input terminal connected to the drain terminals of the first and second sensing transistors P1 and N1. The second inverter 31 has an input terminal connected to the output terminal of the first inverter 30. The third inverter 32 has an input terminal connected to the output terminal of the second inverter 31. Each of the first, second, and third inverters 30, 31, and 32 may be constituted, for example, using a CMOS inverter.

The input circuit 2 comprises a first input transistor (pMOSFET) P2, a second input transistor (nMOSFET) N2, a third input transistor (pMOSFET) P3, and a NAND circuit 40. The first input transistor P2 has a source terminal connected to the high-voltage power supply VCC and a gate terminal connected to the input terminal 1. The second input transistor N2 has a drain terminal connected to the drain terminal of the first input transistor P2 and a gate terminal connected to the input terminal 1. The third input transistor P3 has a source terminal connected to the high-voltage power supply VCC, a gate terminal connected to the inverted detection signal output side of the high-voltage detector 3, and a drain terminal connected to the drain terminal of the first input transistor P2. The NAND circuit 40 has a first input terminal connected to the output terminal of the third inverter 32 of the high-voltage detector 3 and a second input terminal connected to the drain terminal of the first input transistor P2. The protection circuit 4a comprises a cut-off transistor (nMOSFET) N3. The cut-off transistor N3 has a gate terminal connected to the output terminal of the third inverter 32, a drain terminal connected to the source terminal of the second input transistor N2 of the input circuit 2, and a source terminal connected to the low-voltage power supply VSS.

Using FIG. 2, operations of the semiconductor device according to First Embodiment will be described separately for a test mode and a normal operation mode.
Test Mode:

First, when a test mode setting signal having a higher voltage than the high-voltage power supply VCC is inputted into the input terminal 1, the first sensing transistor P1 of the high-voltage detector 3 is turned on. When the first sensing transistor P1 is turned on, the output of the first inverter 30 goes to a low level, and a test mode signal TS, which is a high level signal, is outputted from the output terminal of the second inverter 31. Almost at the same time when the test mode signal TS is outputted, an inverted detection signal DS bar, which is a low level signal, is outputted from the third inverter 32. When the inverted detection signal DS bar is outputted to the gate terminal of the cut-off transistor N3, the cut-off transistor N3 is turned off. When the inverted detection signal DS bar at a low level is outputted, the third input transistor P3 of the input circuit 2 is turned on. A low level signal is inputted into the first input terminal of the NAND circuit 40, and a high level signal is inputted into the second input terminal thereof. Therefore, the NAND circuit 40 outputs a high level signal from the output terminal thereof.
Normal Operation Mode:

When a normal signal is inputted into the input terminal 1, the CMOS inverter comprising the first and second input transistors P2 and N2 outputs a low level signal to the first input terminal of the NAND circuit 40. A high level signal is inputted into the second input terminal of the NAND circuit 40. When the low and high level signals are respectively inputted into the first and second input terminals, the NAND circuit 40 outputs a normal mode signal NS, which is a high level signal, from the output terminal thereof. However, the NAND circuit 40 outputs a low level signal from the output terminal thereof in the state where a normal signal is not inputted.

A circuit having no protection circuit 4a and a circuit having the protection circuit 4a are compared, for example, in the case where 3.3V is supplied as the high-voltage power supply voltage VCC thereto and where a test mode setting signal of 6.5V is applied as an input signal S1 thereto. When a test mode setting signal is applied to the circuit having no protection circuit 4a, 6.5V obtained by subtracting the voltage of the low-voltage power supply VSS from 6.5V is applied to the gate terminal of the second input transistor N2. Here, the low-voltage power supply voltage VSS is assumed to be 0V, and the second input transistor N2 is assumed to be on. In known semiconductor devices, there have been cases where test mode setting signals are applied thereto for one to two minutes, and there have been possibilities that second input transistors N2 may be deteriorated or broken.

On the other hand, the cut-off transistor N3 of the semiconductor device according to First Embodiment of the present invention cuts off the voltage applied between the gate terminal of the second input transistor N2 and the low-voltage power supply VSS when a test mode setting signal having a higher voltage than the high-voltage power supply VCC is inputted into the input terminal 1. Since the third input transistor P3 is on, the high-voltage power supply voltage VCC is applied to the drain terminal of the second input transistor N2. Therefore, the electric field applied between the gate and channel of the second input transistor N2 is 6.5V−3.3V=3.2V, which is obtained by subtracting the high-voltage power supply voltage VCC from the applied gate voltage. Specifically, the electric field applied between the gate and channel of the second input transistor N2 is reduced.

According to the semiconductor device of First Embodiment of the present invention, tests can be conducted without providing a particular input terminal for setting the test mode, and the input circuit is protected from a high voltage during the test mode, thus enabling more reliable test operations.

Second Embodiment

Figure 3:
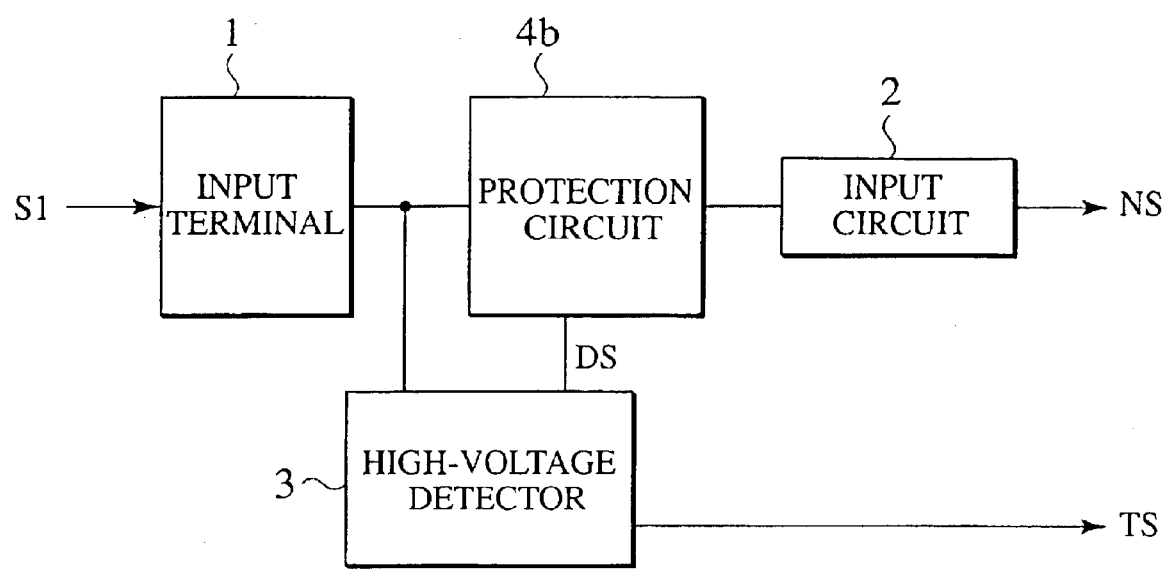
FIG. 3 is a diagram illustrating a semiconductor device according to Second Embodiment of the present invention.
Figure 4:
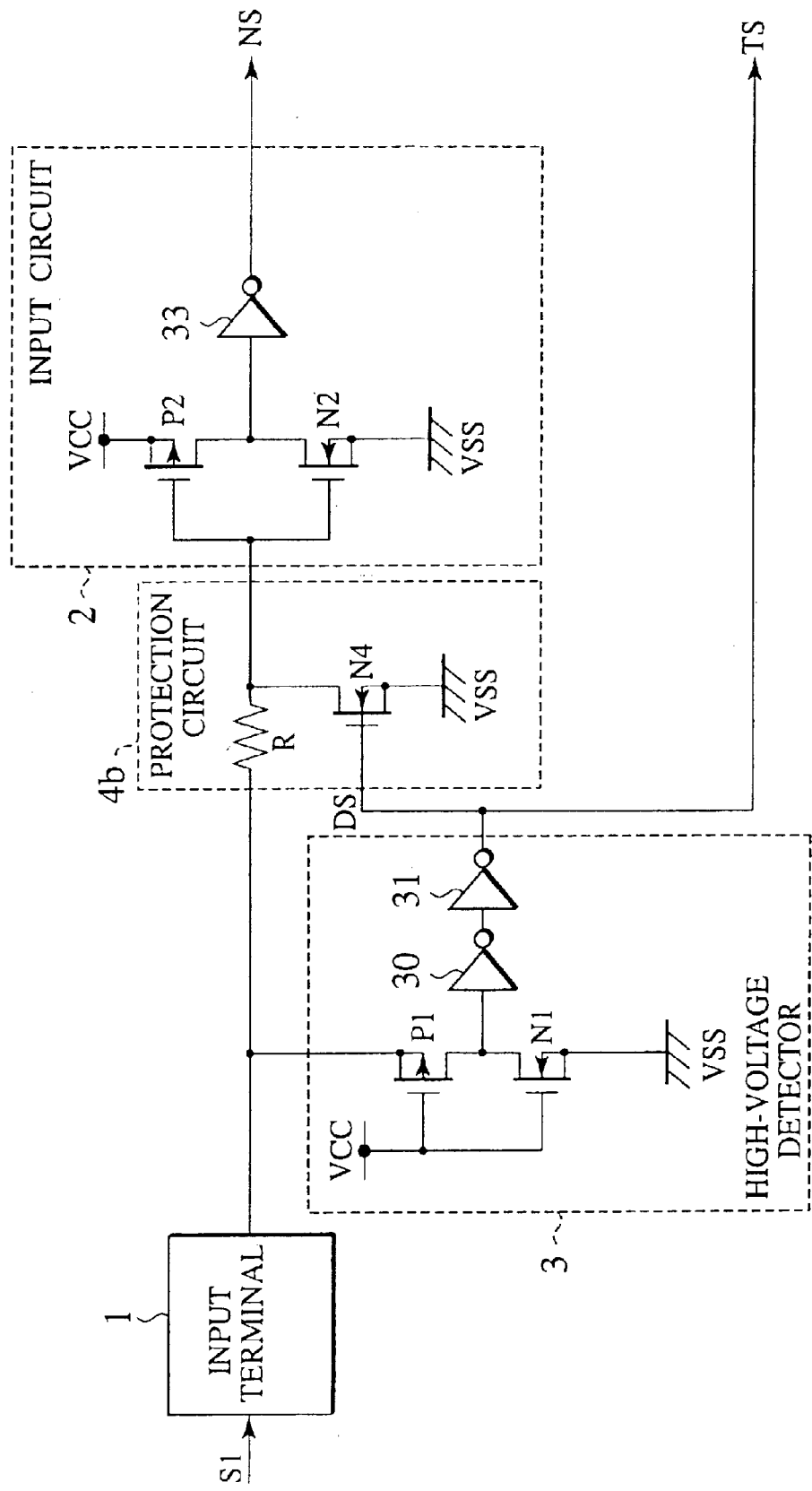
FIG. 4 is a diagram illustrating a circuit example of the semiconductor device according to Second Embodiment of the present invention.

As shown in FIG. 3, a semiconductor device according to Second Embodiment of the present invention comprises an input terminal 1, a high-voltage detector 3 connected to the input terminal 1, a protection circuit 4b connected to the input terminal 1 and the high-voltage detector 3, and an input circuit 2 connected to the output side of the protection circuit 4b. As shown in FIG. 4, the high-voltage detector 3 shown in FIG. 3 comprises, for example, a first sensing transistor P1, a second sensing transistor N1, a first inverter 30, and a second inverter 31. The first sensing transistor P1 has a source terminal connected to the input terminal 1 and a gate terminal connected to a high-voltage power supply VCC. The second sensing transistor N1 has a drain terminal connected to the drain terminal of the first sensing transistor P1, a gate terminal connected to the high-voltage power supply VCC, and a source terminal connected to a low-voltage power supply VSS. The first inverter 30 has an input terminal connected to the drain terminals of the first and second sensing transistors P1 and N1. The second inverter 31 has an input terminal connected to the output terminal of the first inverter 30.

The protection circuit 4b has a voltage dividing resistor R and a voltage dividing transistor (nMOSFET) N4. One end of the voltage dividing resistor R is connected to the input terminal 1 and the input side of the high-voltage detector 3. The other end of the voltage dividing resistor R is used as a divided voltage output terminal. The voltage dividing transistor N4 has a drain terminal connected to the divided voltage output terminal, a gate terminal connected to the output terminal of the second inverter 31 of the high-voltage detector 3, and a source terminal connected to the low-voltage power supply VSS.

The input circuit 2 comprises a first input transistor (pMOSFET) P2, a second input transistor (nMOSFET) N2, and an inverter 33. The first input transistor P2 has a source terminal connected to the high-voltage power supply VCC and a gate terminal connected to the output side of the protection circuit 4b. The second input transistor N2 has a drain terminal connected to the drain terminal of the first input transistor P2, a gate terminal connected to the divided voltage output side of the protection circuit 4b, and a source terminal connected to the low-voltage power supply VSS. The inverter 33 has an input terminal connected to the drain terminals of the first and second input transistors P2 and N2.

Using FIG. 4, operations of the semiconductor device according to Second Embodiment will be described separately for a test mode and a normal operation mode.

Test Mode:

When a test mode setting signal having a higher voltage than the high voltage power supply VCC is inputted into the input terminal 1, the first sensing transistor P1 of the high-voltage detector 3 is turned on. When the first sensing transistor P1 is turned on, the output of the first inverter 30 goes to a low level, and a detection signal DS and a test mode signal TS, which are high level signals, are individually outputted from the output terminal of the second inverter 31. When the detection signal DS at a high level is outputted, the voltage dividing transistor N4 is turned on, and the protection circuit 4b outputs the voltage divided by the voltage dividing resistor R and the on resistance of the voltage dividing transistor N4 to the output side.

Normal Operation Mode:

When a normal signal is inputted into the input terminal 1, the CMOS inverter comprising the first and second input transistors P2 and N2 outputs a low level signal to the input terminal of the inverter 33. When the low level signal is outputted to the input terminal of the inverter 33, the inverter 33 outputs a normal mode signal NS, which is a high level signal, from the output terminal thereof.

A circuit having no protection circuit 4b and a circuit having the protection circuit 4b are compared, for example, in the case where 3.3V is supplied as the high-voltage power supply voltage VCC thereto and where a test mode setting signal of 6.5V is applied as an input signal S1 thereto. When a test mode setting signal is applied to the circuit having no protection circuit 4b, 6.5V obtained by subtracting the low-voltage power supply voltage VSS from a voltage of 6.5V is applied to the gate terminal of the second input transistor N2. In known semiconductor devices, there have been cases where test mode setting signals are applied thereto for one to two minutes, and there have been possibilities that second input transistors N2 may be deteriorated or broken. On the other hand, in Second Embodiment of the present invention, assuming that the ratio of the voltage dividing resistor R to the on resistance of the voltage dividing transistor N4 in the protection circuit 4b is set to 1 to 1, when a test mode setting signal having a higher voltage than the high-voltage power supply VCC is inputted into the input terminal 1, the voltage outputted from the output side of the protection circuit 4b is 3.25V. In other words, the electric field applied between the gate and channel of the second input transistor N2 is reduced.

According to the semiconductor device of Second Embodiment of the present invention, tests can be conducted without providing a particular input terminal for setting the test mode, and the input circuit is protected from a high voltage during the test mode, thus enabling more reliable test operations.

Figure 5:
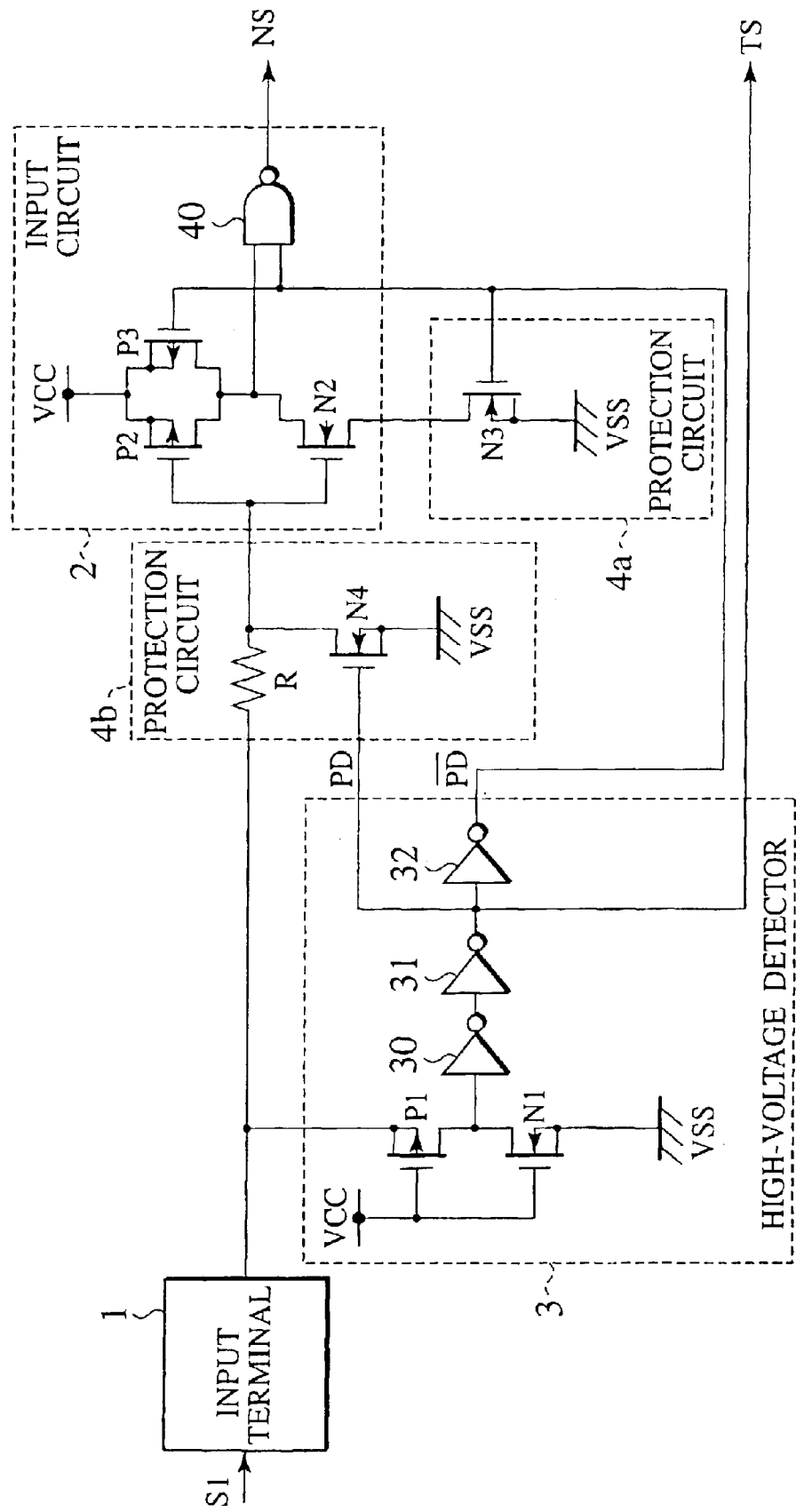
FIG. 5 is a diagram illustrating a circuit example in which the semiconductor devices according to First and Second Embodiments of the present invention are combined.

In addition, as shown in FIG. 5, the protection circuit 4b of Second Embodiment may be combined with the protection circuit 4a of the semiconductor device described in First Embodiment. According to the semiconductor device shown in FIG. 5, reliability can be further improved.

Third Embodiment

Figure 6:
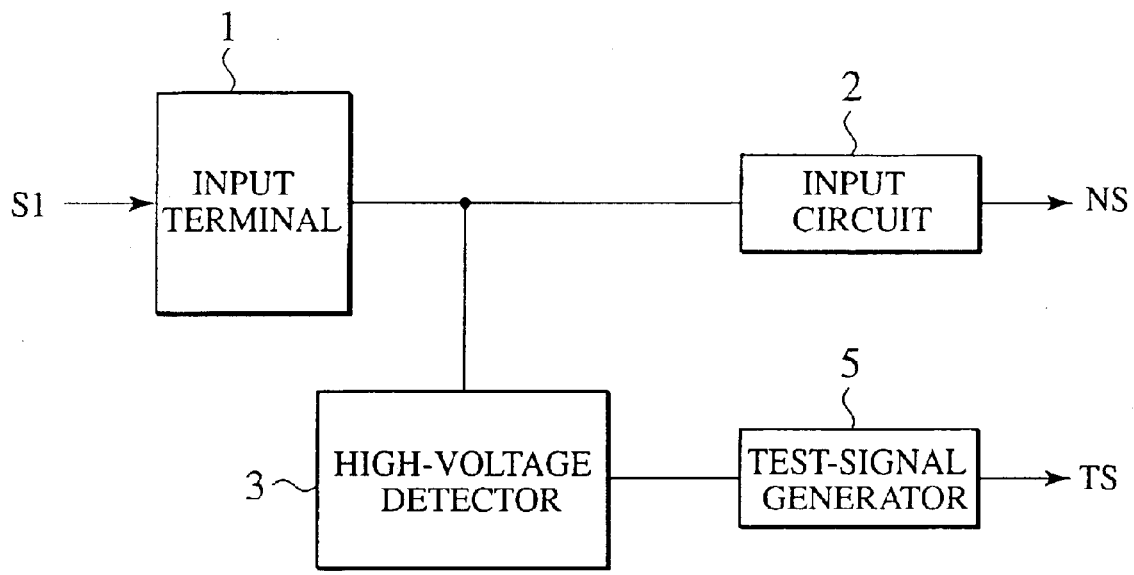
FIG. 6 is a diagram illustrating a semiconductor device according to Third Embodiment of the present invention.
Figure 7:
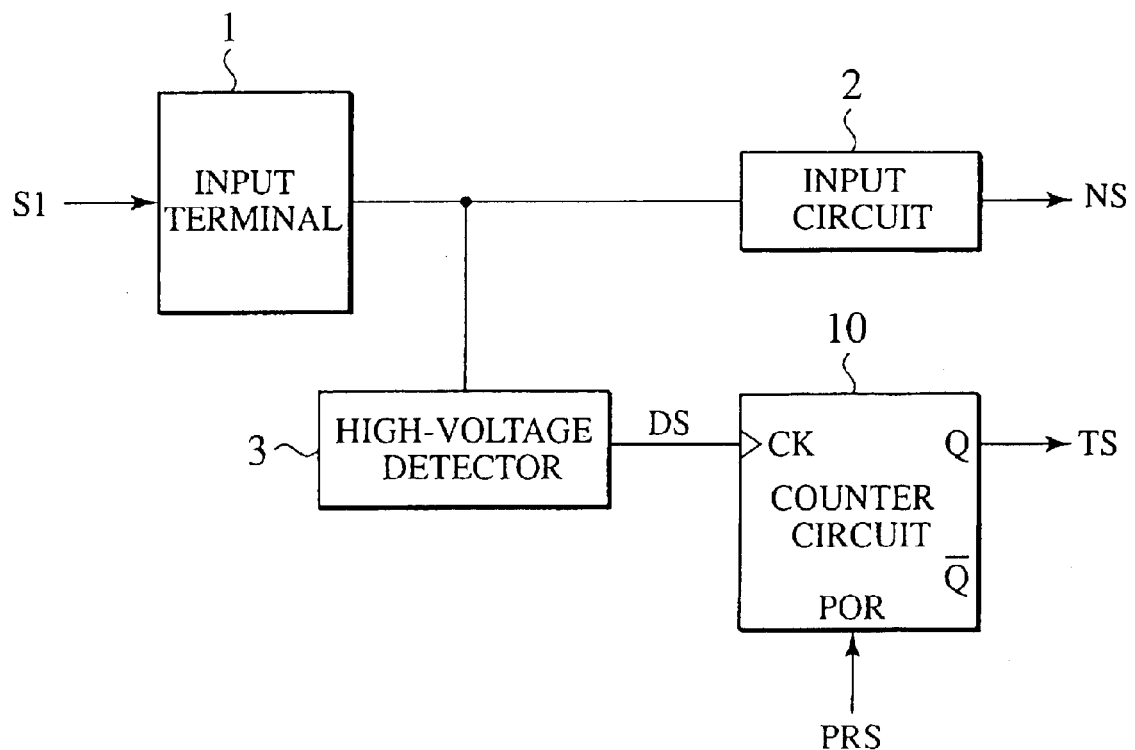
FIG. 7 is a diagram illustrating a circuit example of the semiconductor device according to Third Embodiment of the present invention.

As shown in FIG. 6, in a semiconductor device according to Third Embodiment of the present invention, the protection circuit 4b of the semiconductor device described in Second Embodiment is eliminated, an input terminal 1 and an input circuit 2 are connected, and further, a test-signal generator 5 is provided on the output side of a high-voltage detector 3. As the test-signal generator 5, for example, a counter circuit 10 is used as shown in FIG. 7. The clock input terminal CK of the counter circuit 10 is connected to the output side of the high-voltage detector 3.

Using FIG. 7, FIGS. 8A to 8E, and FIG. 9, operations of the semiconductor device according to Third Embodiment of the present invention will be described separately for a test mode and a normal operation mode. Note that, as shown in FIG. 8A, it is based on the premise that a power-on reset signal PRS as shown in FIG. 8B is inputted into a reset terminal POR and the counter circuit 10 is properly operating at the time of turning on a high-voltage power supply VCC.

Figure 8:
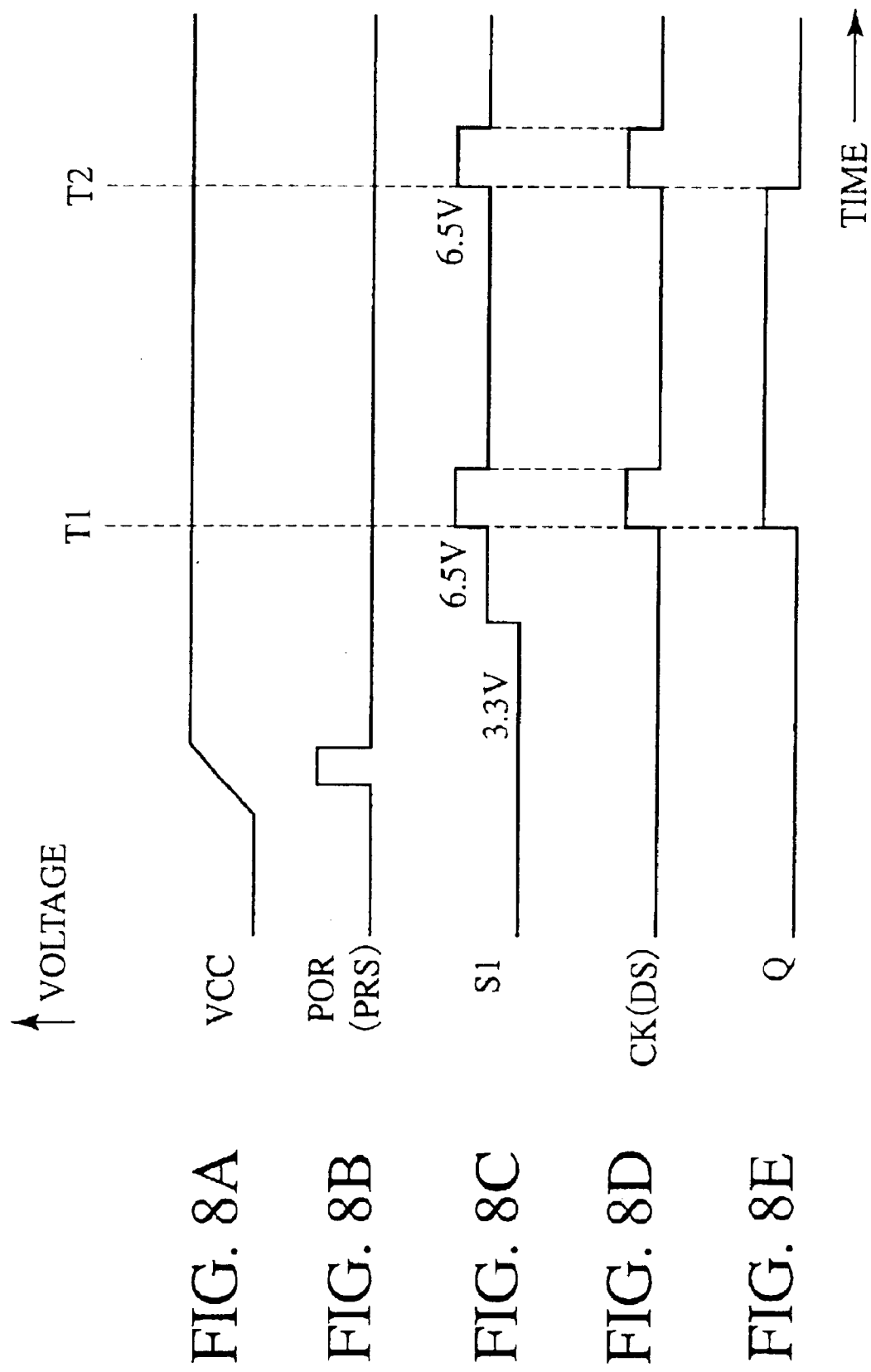
FIGS. 8A to 8E are respectively timing charts illustrating operations of the circuit example of the semiconductor device according to Third Embodiment of the present invention.
Figure 9:
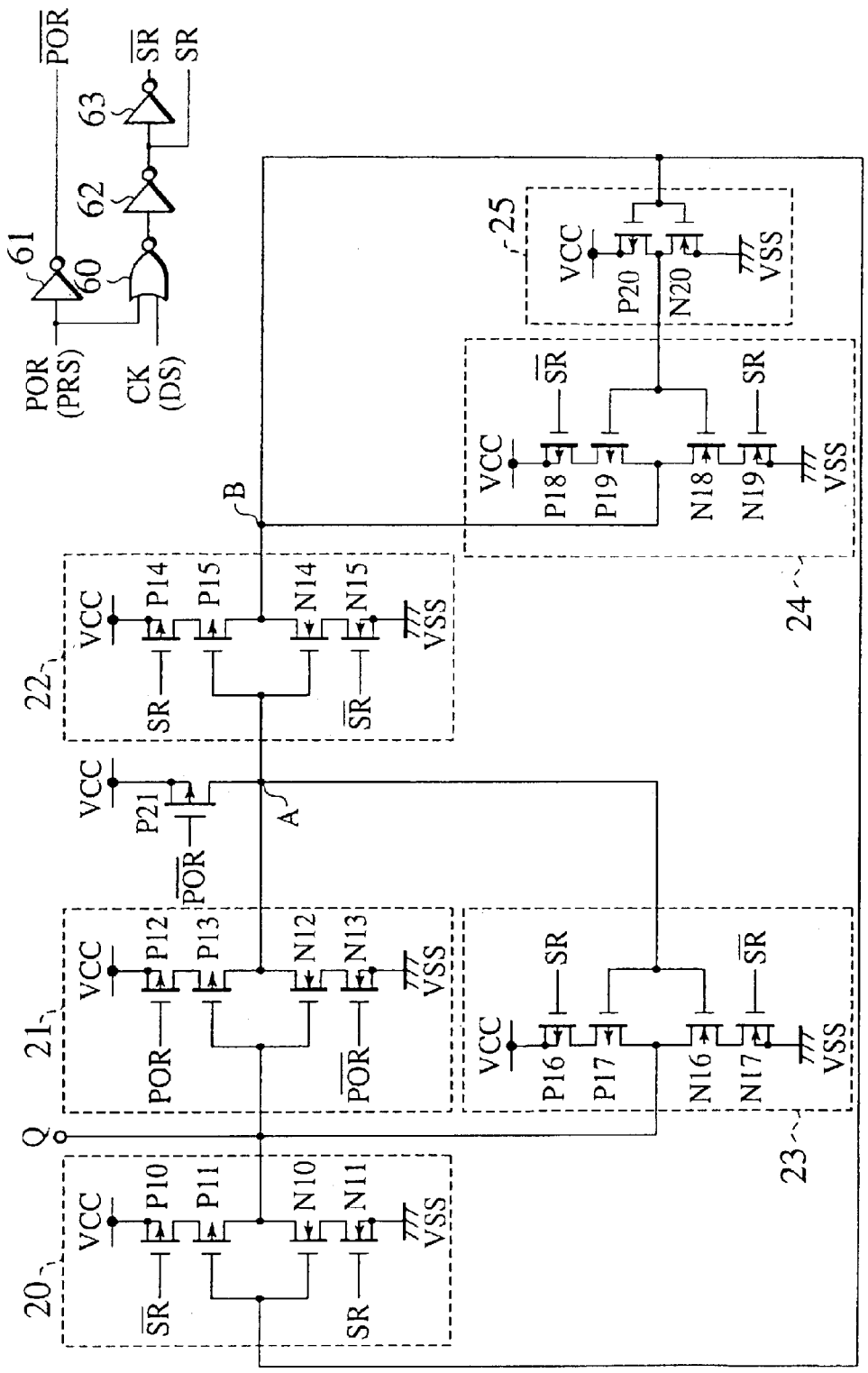
FIG. 9A is a diagram illustrating the preceding stage of the internal circuit of a counter circuit by means of a logic circuit.
FIG. 9B is a diagram illustrating the subsequent stage of the internal circuit of the counter circuit.

Test Mode:

As shown in FIG. 8C, when a test mode setting signal having a higher voltage than the high-voltage power supply VCC is inputted into the input terminal 1, the first sensing transistor P1 of the high-voltage detector 3 shown in FIG. 7 is turned on. When the first sensing transistor P1 is turned on, the output signal of a first inverter 30 goes to a low level, and a second inverter 31 outputs a detection signal DS, which is a high level signal. As shown in FIG. 8D, when a first detection signal DS is inputted into the clock input terminal CK of the counter circuit 10 at time T1, the counter circuit 10 outputs a test mode signal TS, which is a high level signal, from the output terminal Q thereof. Furthermore, as shown in FIG. 8D, when a second detection signal DS is inputted into the clock input terminal CK of the counter circuit 10 at time T2, the counter circuit 10 outputs a low level signal from the output terminal Q thereof. The operations of the high-voltage detector 3 and the input circuit 2 are practically equivalent to those in Second Embodiment. Therefore, the description thereof will be omitted.

There have been cases where test mode setting signals are applied for one to two minutes in test modes and possibilities that second input transistors N2 are deteriorated or broken. According to the semiconductor device of Third Embodiment of the present invention, the turning on and off of a test mode signal can be controlled by a test mode setting signal applied in a very short time of several ns to several tens ns. In other words, even when a test mode setting signal is inputted, the time period that an electric field is generated between the gate and channel of the second input transistor N2 of the input circuit 2 shown in FIG. 4 is shortened.

According to the semiconductor device of Third Embodiment, tests can be conducted without providing a particular input terminal for setting the test mode, and the input circuit is protected from a high voltage during the test mode, thus enabling more reliable test operations.

Furthermore, the counter circuit 10 in FIG. 7 particularly comprises, for example, a logic circuit, which is the preceding stage of an internal circuit as shown in FIG. 9A, and the subsequent stage of the internal circuit as shown in FIG. 9B. The preceding stage of the logic circuit shown in FIG. 9A comprises a first inverter 61, a NOR circuit 60, a second inverter 62, and a third inverter 63. The first inverter 61 has an input terminal connected to the POR terminal and an output terminal connected to a POR bar terminal. The NOR circuit 60 has a first input terminal connected to the POR terminal and the input terminal of the first inverter 61, and a second input terminal connected to the clock input terminal CK. The second inverter 62 has an input terminal connected to the output terminal of the NOR circuit 60 and an output terminal connected to an output terminal SR. The third inverter 63 has an input terminal connected to the output terminal of the inverter 62 and an output terminal connected to an inverted output terminal SR bar.

The internal circuit of the output unit shown in FIG. 9B comprises a first output control inverter 20 having an input side connected to a node B and an output side connected to the output terminal Q, a second output control inverter 21 having an input side connected to the output terminal Q and an output side connected to a node A, a third output control inverter 22 having an input side connected to the node A and an output side connected to the node B, a fourth output control inverter 23 having an input side connected to the node A and an output side connected to the output terminal Q, a fifth output control inverter 24 having an output side connected to the node B, a pMOS transistor P21 having a drain terminal connected to the node A, a source terminal connected to the high-voltage power supply VCC, and a gate terminal connected to the POR bar terminal, and an inverter 25 having an input side connected to the node B and an output side connected to the input side of the fifth output control inverter 24.

Moreover, each of the first to fifth output control inverters 20 to 24 comprises a first pMOS transistor having a source terminal connected to the high-voltage power supply VCC, a gate terminal connected to a first control terminal, and a drain terminal, a second pMOS transistor having a source terminal connected to the drain terminal of the first pMOS transistor, a gate terminal connected to the input of the output control inverter, and a source terminal connected to the output of the output control inverter, a first nMOS transistor having a source terminal connected to a low-voltage power supply VSS, and gate and drain terminals connected to a second control terminal, and a second nMOS transistor having a source terminal connected to the drain terminal of the first nMOS transistor, a gate terminal connected to the input of the output control inverter, and a drain terminal connected to the output of the output control inverter.

The first output control inverter 20 uses the first pMOS transistor as a pMOS transistor P10, the second pMOS transistor as a pMOS transistor P11, the first nMOS transistor as an nMOS transistor N11, and the second nMOS transistor as an nMOS transistor N10. The first and second control terminals of the first output control inverter 20 are connected to the SR bar terminal and the SR terminal respectively.

The second output control inverter 21 uses the first pMOS transistor as a pMOS transistor P12, the second pMOS transistor as a pMOS transistor P13, the first nMOS transistor as an nMOS transistor N13, and the second nMOS transistor as an nMOS transistor N12. The first and second control terminals of the second output control inverter 21 are connected to the POR terminal and the POR bar terminal respectively.

The third output control inverter 22 uses the first pMOS transistor as a pMOS transistor P14, the second pMOS transistor as a pMOS transistor P15, the first nMOS transistor as an nMOS transistor N15, and the second nMOS transistor as an nMOS transistor N14. The first and second control terminals of the third output control inverter 22 are connected to the SR terminal and the SR bar terminal respectively.

The fourth output control inverter 23 uses the first pMOS transistor as a pMOS transistor P16, the second pMOS transistor as a pMOS transistor P17, the first nMOS transistor as an nMOS transistor N17, and the second nMOS transistor as an nMOS transistor N16. The first and second control terminals of the fourth output control inverter 23 are connected to the SR terminal and the SR bar terminal respectively.

The fifth output control inverter 24 uses the first pMOS transistor as a pMOS transistor P18, the second pMOS transistor as a pMOS transistor P19, the first nMOS transistor as an nMOS transistor N19, and the second nMOS transistor as an nMOS transistor N18. The first and second control terminals of the fifth output control inverter 24 are connected to the SR bar terminal and the SR terminal respectively.

The inverter 25 comprises a pMOS transistor P20 having a source terminal connected to the high-voltage power supply VCC, a gate terminal connected to the input of the inverter 25, and a source terminal connected to the output of the inverter 25, and an nMOS transistor N20 having a source terminal connected to the low-voltage power supply VSS, a gate terminal connected to the input of the inverter 25, and a drain terminal connected to the output of the inverter 25.

Figure 10:
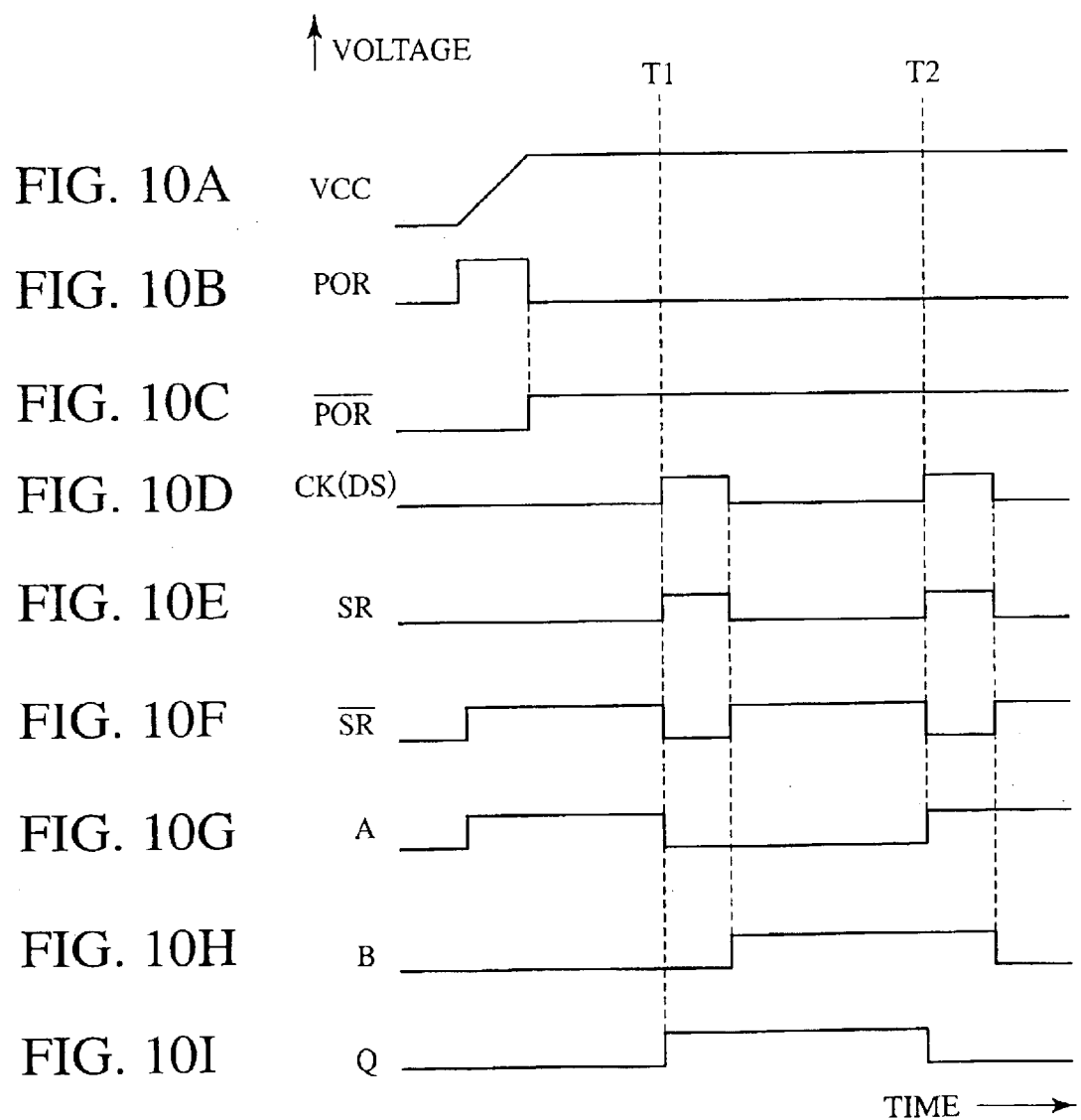
FIGS. 10A to 10I are timing charts illustrating operations of the counter circuit respectively.

Operations of the counter circuit 10 shown in FIGS. 9A and 9B will be described using FIGS. 10A to 10J. As shown in FIG. 10A, it is based on the premise that a power-on reset signal PRS as shown in FIG. 10B is inputted into the reset terminal POR and the counter circuit 10 is properly operating at the time of turning on the high-voltage power supply VCC. The first inverter 61 shown in FIG. 9A receives a power-on reset signal PRS, and outputs the inverted signal of the power-on reset signal PRS as shown in FIG. 10C from the POR bar terminal.

As shown in FIG. 10E, when a detection signal DS, which is a high level signal, is inputted into the clock input terminal CK at time T1, the NOR circuit 60 shown in FIG. 9A outputs a low level signal. When the low level signal is outputted from the NOR circuit 60, the second inverter 62 outputs a high level signal to the SR terminal as shown in FIG. 10F. Moreover, when the high level signal is outputted from the second inverter 62, the third inverter 63 outputs a low level signal to the SR bar terminal as shown in FIG. 10G. The signals outputted from the POR terminal, the POR bar terminal, the SR terminal, and the SR bar terminal shown in FIGS. 7 and 9A are individually inputted into the circuit shown in FIG. 9B. When a power-on reset signal PRS, which is a high level signal, is inputted into the POR terminal, the POR bar terminal outputs a low level signal, and the second output control inverter 21 is turned off. Meanwhile, when the pMOS transistor P21 is turned on, the electric potential at the node A goes to a high level as shown in FIG. 10H. In the state where a low level signal is outputted from the SR terminal and a high-level signal is outputted from the SR bar terminal, the third and fourth output control inverters 22 and 23 are turned on, and the first and fifth output control inverters 20 and 24 are turned off. Since the electric potential at the node A is at a high level, the node B and the output terminal Q output low level signals. When the power-on reset signal goes to a low level, a low level signal is outputted from the POR terminal and a high level signal is outputted from the POR bar terminal.

Consequently, the pMOS transistor P21 is turned off, and the second output control inverter 21 is turned on. Since the second and fourth output control inverters 21 and 23 form a loop in which each of the second and fourth output control inverters 21 and 23 has the input side thereof connected to the other's output side, the output terminal Q is set to a low level, and the node A is set to a high level.

When a detection signal DS, which is a high level signal, is inputted at time T1 as shown in FIG. 10E, the SR terminal outputs a high level signal as shown in FIG. 10F, and the SR bar terminal outputs a low level signal as shown in FIG. 10G. When the high level signal and low level signal are outputted from the SR terminal and the SR bar terminal respectively, the third and fourth output control inverters 22 and 23 are turned off, and the first and fifth output control inverters 20 and 24 are turned on. At time T1, the voltage at the node B is maintained at a low level by the inverter 25 and the fifth output control inverter as shown in FIG. 10I. Meanwhile, the first output control inverter 20 outputs a high level signal to the output terminal Q as shown in FIG. 10J, and a low level signal is outputted to the node A as shown in FIG. 10H. When the detection signal DS changes from a high level signal, the third and fourth output control inverters 22 and 23 are turned on, and the first and fifth output control inverters 20 and 24 are turned off. Since the electric potential at the node A is at a low level, a high level signal is outputted to the node B, and the output terminal Q is maintained at a high level.

When the subsequent detection signal DS is inputted at time T2 as shown in FIG. 10E, the SR terminal outputs a high level signal as shown in FIG. 10F, and the SR bar terminal outputs a low level signal as shown in FIG. 10G. When the high level signal and low level signal are outputted from the SR terminal and the SR bar terminal respectively, the third and fourth output control inverters 22 and 23 are turned off, and the first and fifth output control inverters 20 and 24 are turned on. At time T2, the voltage at the node B is maintained at a high level by the inverter 25 and the fifth output control inverter. Meanwhile, the first output control inverter 20 outputs a low level signal to the output terminal Q, and a high level signal is outputted from the node A. When the subsequent detection signal DS changes from a high level signal, the third and fourth output control inverters 22 and 23 are turned on, and the first and fifth output control inverters 20 and 24 are turned off. Since the electric potential at the node A is at a high level, a low level signal is outputted to the node B, and the output terminal Q is maintained at a low level.

First and Second Embodiments are characterized by that the electric field applied to an input circuit is reduced. Meanwhile, Third Embodiment shortens the time of applying an electric field to an input circuit, thus avoiding reliability problems. First and Second Embodiments can be separately combined with Third Embodiment to be used. Thus, a more reliable semiconductor device can be realized.

According to the semiconductor device of Third Embodiment of the present invention, tests can be conducted without providing a particular input terminal for setting the test mode, and the input circuit is protected from a high voltage during the test mode, thus enabling more reliable test operations.

Fourth Embodiment

Figure 11:
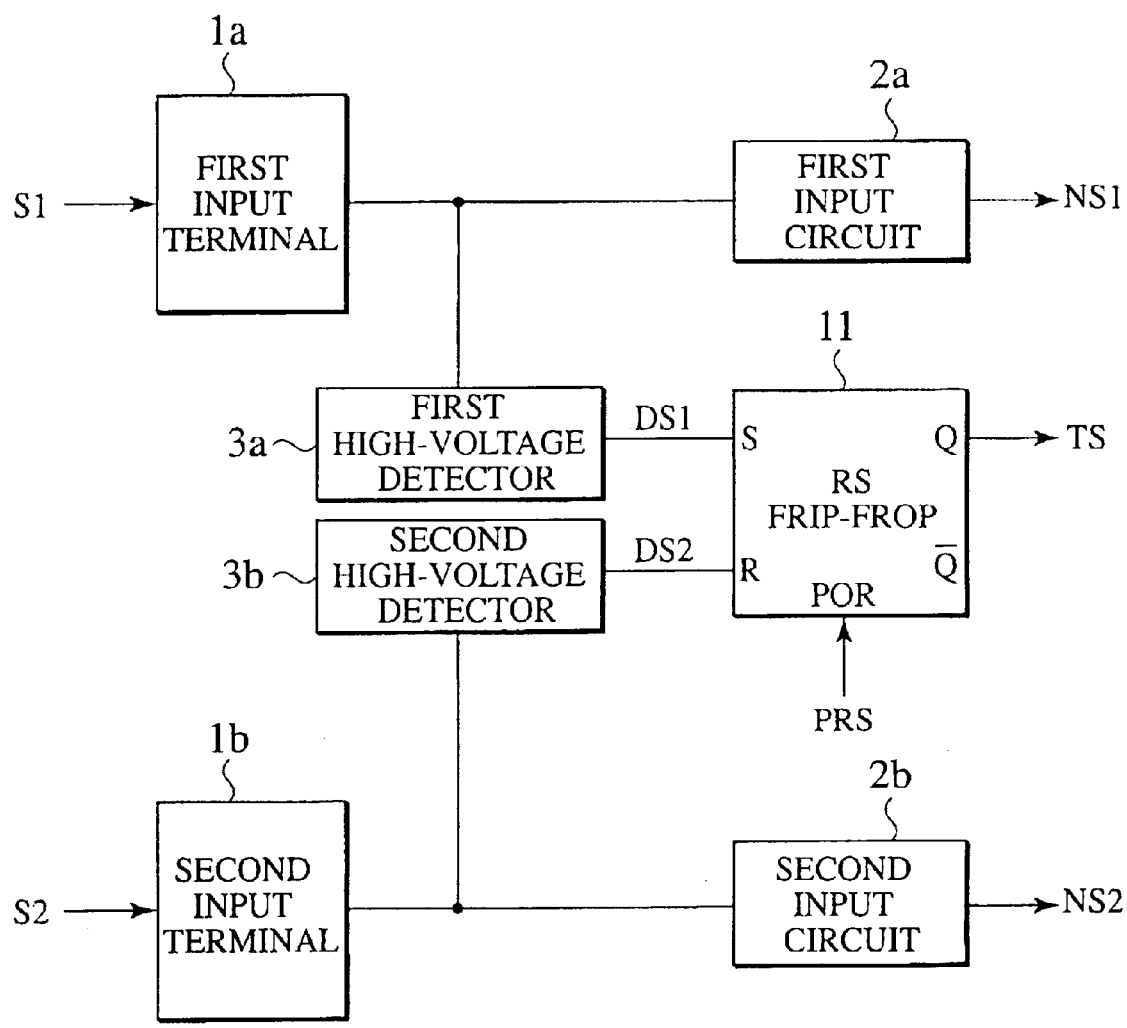
FIG. 11 is a diagram illustrating a circuit example of a semiconductor device according to Fourth Embodiment of the present invention.

As shown in FIG. 11, a semiconductor device according to Fourth Embodiment of the present invention comprises a first input terminal 1a for inputting, as a first input signal S1, any one of a first normal signal and a first test mode setting signal having a higher voltage than the first normal signal, a first input circuit 2a for outputting a first normal mode signal NS1 when a first normal signal is inputted thereto, a first high-voltage detector 3a for generating a first detection signal DS1 when a first test mode setting signal is inputted thereto a second input terminal for inputting, as a second input signal S2, any one of a second normal signal and a second test mode setting signal having a higher voltage than the second normal signal, a second input circuit 2b for generating a second normal mode signal NS2 when a second normal signal is inputted thereto, a second high-voltage detector 3b for generating a second detection signal DS2 when a test mode setting signal is inputted thereto, and a flip-flop circuit 11 for alternately switching a test mode signal between on and off in accordance with first and second detection signals DS1 and DS2.

Using FIGS. 12A to 12G, operations of the semiconductor device according to Fourth Embodiment of the present invention will be described separately for a test mode and a normal operation mode. Note that it is based on the premise that a power-on reset signal PRS as shown in FIG. 12B is inputted into a reset terminal POR and the counter circuit 10 is properly operating at the time of turning on a high-voltage power supply VCC as shown in FIG. 12A.

Test Mode:

When a first test mode setting signal having a higher voltage than the high-voltage power supply VCC is inputted into the first input terminal 1a at time T1 as shown in FIG. 12C, the first high-voltage detector 3a outputs a first detection signal DS1, which is a high level signal. When the first detection signal DS1 is inputted into a set terminal S as shown in FIG. 12E, the flip-flop circuit 11 outputs a test mode signal TS, which is a high level signal, from the output terminal Q thereof as shown in FIG. 12G.

On the other hand, when a second test mode setting signal having a higher voltage than the high-voltage power supply VCC is inputted into the second input terminal 1b as shown in FIG. 12D, the second high-voltage detector 3b outputs a second detection signal DS2, which is a high level signal. When the second detection signal DS2 is inputted into the reset terminal R as shown in FIG. 12F, the flip-flop circuit 11 outputs a low level signal from the output terminal Q thereof as shown in FIG. 12G. The other operations are practically equivalent to those of Third Embodiment and therefore will not be further described.

According to the semiconductor device of Fourth Embodiment of the present invention, tests can be conducted without providing a particular input terminal for setting the test mode, and the input circuit is protected from a high voltage during the test mode, thus enabling more reliable test operations.

Various modifications will become possible for those skilled in the art after receiving the teachings of the present disclosure without departing from the scope thereof.

What is claimed is:

1. A semiconductor device comprising:
    a high-voltage detector for generating a test mode signal and a detection signal when a test mode setting signal is inputted from an input terminal for inputting, as a first input signal, any one of a normal signal and the test mode setting signal having a higher voltage than the normal signal;
    an input circuit for generating a normal mode signal in accordance with the normal signal; and
    a protection circuit for reducing an electric field between an input side and a low-voltage power supply side of the input circuit in accordance with the detection signal, the electric field being generated by inputting the test mode setting signal thereto.

2. The semiconductor device of claim 1, wherein the protection circuit includes a cut-off transistor for cutting off a connection path between the input side of the input circuit and a low-voltage power supply in accordance with the detection signal.

3. The semiconductor device of claim 1, wherein the protection circuit includes a cut-off transistor having a drain terminal connected to the low-voltage power supply side of the input circuit, a source terminal connected to a low-voltage power supply, and a gate terminal connected to a detection signal output side of the high-voltage detector.

4. The semiconductor device of claim 1, wherein the input circuit includes:
    a first input transistor having a source terminal connected to a high-voltage power supply and a gate terminal connected to the input terminal;
    a second input transistor having a drain terminal connected to a drain terminal of the first input transistor and a gate terminal connected to the input terminal;
    a third input transistor having a source terminal connected to the high-voltage power supply, a gate terminal connected to an output side of the high-voltage detector, and a drain terminal connected to the drain terminal of the first input transistor; and
    a NAND circuit having a first input terminal connected to the output side of the high-voltage detector and a second input terminal connected to the drain terminals of the first, third, and second input transistors.

5. The semiconductor device of claim 1, wherein the high-voltage detector includes:
    a first sensing transistor having a source terminal connected to the input terminal, a gate terminal connected to a high-voltage power supply, and a drain terminal;
    a second sensing transistor having a drain terminal connected to the drain terminal of the first sensing transistor, a gate terminal connected to the high-voltage power supply, and a source terminal connected to a low-voltage power supply;
    a first inverter having an input terminal connected to the drain terminals of the first and second sensing transistors;
    a second inverter having an input terminal connected to an output terminal of the first inverter; and
    a third inverter having an input terminal connected to an output terminal of the second inverter.

6. A semiconductor device comprising:
    a high-voltage detector for generating a test mode signal and a detection signal when a test mode setting signal is inputted from an input terminal for inputting, as a first input signal, any one of a normal signal and the test mode setting signal having a higher voltage than the normal signal;
    a protection circuit for outputting a divided voltage of the test mode setting signal to an output side in accordance with the detection signal; and
    an input circuit for outputting a normal mode signal in accordance with the divided voltage.

7. The semiconductor device of claim 6, wherein the protection circuit includes:
    a voltage dividing transistor for dividing a voltage of the test mode setting signal in accordance with the detection signal to transmit the divided test mode setting signal to an input side of the input circuit.

8. The semiconductor device of claim 6, wherein the protection circuit includes:

a voltage dividing resistor having one end connected to the input terminal and the other end used as an output side; and a voltage dividing transistor having a drain terminal connected to the output side of the voltage dividing resistor, a gate terminal connected to an output side of the high-voltage detector, and a source terminal connected to a low-voltage power supply.

9. The semiconductor device of claim 6, wherein the input circuit includes:

a first input transistor having a source terminal connected to a high-voltage power supply, a gate terminal connected to the output side of the protection circuit, and a drain terminal; and a second input transistor having a drain terminal connected to the drain terminal of the first input transistor and a gate terminal connected to the output side of the protection circuit.

10. The semiconductor device of claim 6, wherein the high-voltage detector includes:

a first sensing transistor having a source terminal connected to the input terminal, a gate terminal connected to a high-voltage power supply, and a drain terminal;

a second sensing transistor having a drain terminal connected to the drain terminal of the first sensing transistor, a gate terminal connected to the high-voltage power supply, and a source terminal connected to a low-voltage power supply;

a first inverter having an input terminal connected to the drain terminals of the first and second sensing transistors; and a second inverter having an input terminal connected to an output terminal of the first inverter.

11. A semiconductor device comprising:

an input circuit for generating a normal mode signal when a normal signal is inputted from an input terminal for inputting, as a first input signal, any one of the normal signal and a test mode setting signal having a higher voltage than the normal signal;

a high-voltage detector for generating a detection signal in accordance with the test mode setting signal; and a test-signal generator for generating a test mode signal using the detection signal as a trigger.

12. The semiconductor device of claim 11, wherein the test-signal generator is a counter circuit having:

a clock terminal connected to a detection signal output side of the high-voltage detector; and an output terminal for outputting the test mode signal.

13. A semiconductor device comprising;

a first input circuit for outputting a first normal mode signal when a first normal signal is inputted from a first input terminal for inputting, as a first input signal, any one of the first normal signal and a first test mode setting signal having a higher voltage than the first normal signal;

a first high-voltage detector for generating a first detection signal when the first test mode setting signal is inputted;

a second input circuit for generating a second normal mode signal when a second normal signal is inputted from a second input terminal for inputting, as a second input signal, any one of the second normal signal and a second test mode setting signal having a higher voltage than the second normal signal;

a second high-voltage detector for generating a second detection signal when the second test-mode setting signal is inputted; and a flip-flop circuit for alternately switching a test mode signal between on and off in accordance with the first and second detection signals.

14. The semiconductor device of claim 13, wherein the first input circuit includes:

a first input transistor having a source terminal connected to a high-voltage power supply, a gate terminal connected to the first input terminal, and a drain terminal;

a second input transistor having a drain terminal connected to the drain terminal of the first input transistor, a gate terminal connected to the first input terminal, and a source terminal; and an inverter having an input terminal connected to the drain terminals of the first and second input transistors.

15. the semiconductor device of claim 13, wherein the second input circuit includes:

a first input transistor having a source terminal connected to a high-voltage power supply, a gate terminal connected to the second input terminal, and a drain terminal;

a second input transistor having a drain terminal connected to the drain terminal of the first input transistor, a gate terminal connected to the second input terminal, and a source terminal; and an inverter having an input terminal connected to the drain terminals of the first and second input transistors.

16. The semiconductor device of claim 13, wherein the first high-voltage detector includes:

a first sensing transistor having a source terminal connected to the first input terminal, a gate terminal connected to a high-voltage power supply, and a drain terminal;

a second sensing transistor having a drain terminal connected to the drain terminal of the first sensing transistor, a gate terminal connected to the high-voltage power supply, and a source terminal connected to a low-voltage power supply;

a first inverter having an input terminal connected to the drain terminals of the first and second sensing transistors; and a second inverter having an input terminal connected to an output terminal of the first inverter and an output terminal for outputting the first detection signal.

17. The semiconductor device of claim 13, wherein the second high-voltage detector includes:

a first sensing transistor having a source terminal connected to the second input terminal, a gate terminal connected to a high-voltage power supply, and a drain terminal;

a second sensing transistor having a drain terminal connected to the drain terminal of the first sensing transistor, a gate terminal connected to the high-voltage power supply, and a source terminal connected to a low-voltage power supply;

a first inverter having an input terminal connected to the drain terminals of the first and second sensing transistors; and a second inverter having an input terminal connected to an output terminal of the first inverter and an output terminal for outputting the second detection signal.

* * * * *